US009279575B2

(12) United States Patent
Moriyama et al.

(10) Patent No.: US 9,279,575 B2
(45) Date of Patent: *Mar. 8, 2016

(54) LIGHT EMITTING MODULE HAVING HEAT CONDUCTIVE SUBSTRATE

(71) Applicants: Toshiba Lighting & Technology Corporation, Yokosuka-shi, Kanagawa (JP); Kabushiki Kaisha Toshiba, Minato-ku, Tokyo (JP)

(72) Inventors: Takayoshi Moriyama, Miura (JP); Kazunari Higuchi, Yokosuka (JP); Sumio Hashimoto, Yokosuka (JP); Shinichi Kumashiro, Yokosuka (JP)

(73) Assignees: Kabushiki Kaisha Toshiba, Tokyo (JP); Toshiba Lighting & Technology Corporation, Kanagawa-ken (JP)

( * ) Notice: Subject to any disclaimer, the term of this patent is extended or adjusted under 35 U.S.C. 154(b) by 225 days.

This patent is subject to a terminal disclaimer.

(21) Appl. No.: 14/158,144

(22) Filed: Jan. 17, 2014

(65) Prior Publication Data

US 2014/0133165 A1 May 15, 2014

Related U.S. Application Data

(63) Continuation of application No. 13/665,227, filed on Oct. 31, 2012, now Pat. No. 8,668,355, which is a continuation of application No. 12/473,447, filed on May 28, 2009, now Pat. No. 8,556,460.

(30) Foreign Application Priority Data

May 30, 2008 (JP) .................................. 2008-142063
Mar. 24, 2009 (JP) .................................. 2009-071276

(51) Int. Cl.
*F21S 4/00* (2006.01)
*H05K 1/05* (2006.01)
(Continued)

(52) U.S. Cl.
CPC ................. *F21V 29/00* (2013.01); *F21S 8/026* (2013.01); *F21V 19/0055* (2013.01);
(Continued)

(58) Field of Classification Search
CPC ... F21V 23/005; F21V 29/004; F21V 29/503; H01L 33/64; H05K 1/0201; H05K 1/0204; H05K 1/0206; H05K 1/05
See application file for complete search history.

(56) References Cited

U.S. PATENT DOCUMENTS 3,385,732 A 5/1968 Curran
3,539,801 A 11/1970 Bobrick
(Continued)

FOREIGN PATENT DOCUMENTS

CN 2639704 Y 9/2004
CN 2665920 Y 12/2004
(Continued)

OTHER PUBLICATIONS

Jan. 22, 2015—(CN) Notice of Second Office Action—App 201310014924.2.
(Continued)

*Primary Examiner* — Ismael Negron
(74) *Attorney, Agent, or Firm* — Banner & Witcoff, Ltd.

(57) ABSTRACT

A substrate having a plurality of light-emitting elements mounted thereon is described. The substrate may be mounted in a lighting apparatus and may include a surface on which the plurality of light-emitting elements are mounted and one or more holes through which heat may be conducted from the first surface to another surface of the substrate. For example, a heat conductive and electrically non-conductive material may cover a surface of the one or more holes. According to some arrangements, the surface of the substrate may include an electrically non-conductive layer and an electrically conductive layer such that the electrically non-conductive layer is electrically isolated or separated from the electrically conductive layer.

2 Claims, 7 Drawing Sheets

(51) Int. Cl.
| | |
|---|---|
| *F21V 29/00* | (2015.01) |
| *F21S 8/02* | (2006.01) |
| *F21V 19/00* | (2006.01) |
| *F21V 21/00* | (2006.01) |
| *F21V 17/12* | (2006.01) |
| *F21Y 101/02* | (2006.01) |
| *H05K 1/02* | (2006.01) |

(52) U.S. Cl.
CPC .............. *F21V 21/00* (2013.01); *F21V 29/004* (2013.01); *H05K 1/0271* (2013.01); *F21V 17/12* (2013.01); *F21V 19/0035* (2013.01); *F21Y 2101/02* (2013.01); *H05K 1/0206* (2013.01); *H05K 2201/09063* (2013.01); *H05K 2201/10106* (2013.01); *H05K 2201/10409* (2013.01); *H05K 2201/10598* (2013.01)

(56) References Cited

U.S. PATENT DOCUMENTS

| | | |
|---|---|---|
| 3,566,005 A | 2/1971 | Shaheen |
| 4,254,453 A | 3/1981 | Mouyard et al. |
| 4,400,673 A | 8/1983 | Gilman |
| 4,434,321 A | 2/1984 | Betts |
| 4,641,222 A | 2/1987 | Derfiny et al. |
| 5,400,229 A | 3/1995 | Lin |
| 5,519,596 A | 5/1996 | Woolverton |
| 5,767,576 A | 6/1998 | Kobayashi et al. |
| 6,095,663 A | 8/2000 | Pond et al. |
| 6,367,949 B1 | 4/2002 | Pederson |
| 6,422,716 B2 | 7/2002 | Henrici et al. |
| 6,498,708 B2 | 12/2002 | Schilloff et al. |
| 6,552,658 B1 | 4/2003 | Roller et al. |
| 6,659,627 B2 | 12/2003 | Caluori |
| 6,840,654 B2 | 1/2005 | Guerrieri et al. |
| 7,018,070 B2 | 3/2006 | McCoy |
| 7,207,695 B2 | 4/2007 | Coushaine et al. |
| 7,217,008 B2 | 5/2007 | Thompson et al. |
| 7,281,818 B2 | 10/2007 | You et al. |
| 7,357,541 B2 | 4/2008 | Gamache et al. |
| 7,549,772 B2 | 6/2009 | Wang |
| 7,722,227 B2 | 5/2010 | Zhang et al. |
| 7,758,223 B2 | 7/2010 | Osawa et al. |
| 7,795,635 B2 | 9/2010 | Jeong et al. |
| 7,806,562 B2 | 10/2010 | Behr et al. |
| 7,824,077 B2 | 11/2010 | Chen et al. |
| 7,841,740 B2 | 11/2010 | Zhou et al. |
| 7,845,829 B2 | 12/2010 | Shaner |
| 7,914,162 B1 | 3/2011 | Huang |
| 7,918,591 B2 | 4/2011 | Lynch |
| 7,932,909 B2 | 4/2011 | Niles et al. |
| 8,128,263 B2 | 3/2012 | Higuchi et al. |
| 2003/0156416 A1 | 8/2003 | Stopa et al. |
| 2004/0014338 A1 | 1/2004 | Takai et al. |
| 2005/0116235 A1 | 6/2005 | Schultz et al. |
| 2005/0128744 A1 | 6/2005 | You et al. |
| 2006/0062127 A1 | 3/2006 | Burghardt et al. |
| 2006/0187660 A1 | 8/2006 | Liu |
| 2007/0109796 A1 | 5/2007 | Johnson |
| 2007/0221941 A1 | 9/2007 | Jeong et al. |
| 2007/0223218 A1 | 9/2007 | You et al. |
| 2008/0007955 A1 | 1/2008 | Li |
| 2008/0025028 A1 | 1/2008 | Gloisten et al. |
| 2008/0084701 A1 | 4/2008 | Van De Ven et al. |
| 2008/0273341 A1 | 11/2008 | Wilcox et al. |
| 2008/0278955 A1 | 11/2008 | Boyer |
| 2009/0021931 A1 | 1/2009 | Mayer et al. |
| 2009/0097249 A1 | 4/2009 | Lee et al. |
| 2009/0231849 A1 | 9/2009 | Tseng et al. |
| 2009/0244894 A1 | 10/2009 | Zhou et al. |
| 2009/0257224 A1 | 10/2009 | Huang et al. |
| 2009/0284972 A1 | 11/2009 | Chang |
| 2009/0290345 A1 | 11/2009 | Shaner |
| 2010/0038657 A1 | 2/2010 | Higuchi et al. |
| 2010/0053950 A1 | 3/2010 | Higuchi et al. |
| 2010/0118541 A1 | 5/2010 | Li |
| 2010/0128491 A1 | 5/2010 | Hashimoto et al. |
| 2010/0214790 A1 | 8/2010 | Wu |
| 2010/0259919 A1 | 10/2010 | Khazi et al. |
| 2011/0075411 A1 | 3/2011 | Van De Ven et al. |
| 2011/0075427 A1 | 3/2011 | Higuchi et al. |
| 2011/0096556 A1 | 4/2011 | Alexander et al. |

FOREIGN PATENT DOCUMENTS

| | | |
|---|---|---|
| CN | 1902757 A | 1/2007 |
| CN | 1921231 A | 2/2007 |
| CN | 101034233 A | 9/2007 |
| CN | 101176216 A | 5/2008 |
| CN | 201072101 Y | 6/2008 |
| CN | 201078678 Y | 6/2008 |
| DE | 19972 1061 | 11/1997 |
| DE | 102004028211 A1 | 12/2005 |
| EP | 1030099 A2 | 8/2000 |
| EP | 1767967 A2 | 3/2007 |
| EP | 1772668 A1 | 4/2007 |
| EP | 1950491 A1 | 7/2008 |
| EP | 2163809 A2 | 3/2010 |
| EP | 2177825 A1 | 4/2010 |
| EP | 2180241 A2 | 4/2010 |
| JP | H06-21080 | 3/1994 |
| JP | 11-273446 A | 10/1999 |
| JP | 2000-149610 A | 5/2000 |
| JP | 2001-313260 A | 11/2001 |
| JP | 2005-228581 A | 8/2005 |
| JP | 2006-172895 A | 6/2006 |
| JP | 2006-179443 A | 7/2006 |
| JP | 2006-185602 A | 7/2006 |
| JP | 2006-228932 A | 8/2006 |
| JP | 2006-260986 A | 9/2006 |
| JP | 2007-096235 A | 4/2007 |
| JP | 2007-294847 A | 11/2007 |
| JP | 2007-299679 A | 11/2007 |
| JP | 2008-159455 A | 7/2008 |
| JP | 2009-064637 A | 3/2009 |
| WO | 2007/028397 A2 | 3/2007 |

OTHER PUBLICATIONS

EP Search Report issued in EP 0901629 on Jan. 23, 2012.
Chinese Office Action issued in CN200910223690.6 dated Jan. 19, 2011.
Extended Search Report issued in EP 00177305.9 on Dec. 28, 2010.
Chinese Office Action issued in CN2010110800539310 dated Nov. 11, 2010.
European Search Report issued in EP 09007089.7 on Jan. 18, 2011.
Extended European Search Report mailed Mar. 29, 2010 issue in EP Application No. 09011772.
European Search Report issued in EP 09011025.5 on Oct. 22, 2009.
Chinese Office Action issued in CN200910143053.8 dated Mar. 30, 2012.
Final Office Action received in corresponding U.S. Appl. No. 12/473,447 mailed on Jul. 31, 2012.
Non Final Office Action received in corresponding U.S. Appl. No. 12/473,447 mailed on May 1, 2012.
Final Office Action received in corresponding U.S. Appl. No. 12/473,447 mailed on Dec. 9, 2011.
Office Action received in corresponding U.S. Appl. No. 13/590,804 mailed on Nov. 26, 2012.
Non Final Office Action received in corresponding U.S. Appl. No. 12/473,447 mailed on Aug. 8, 2011.
Notice of Allowance issued in corresponding U.S. Appl. No. 12/473,447 mailed Nov. 13, 2012.
Japanese Office Action issued in corresponding Japanese Patent Application No. 2009-071276, dated Jan. 29, 2013.
Notice of Allowance issued in corresponding U.S. Appl. No. 13/590,804 mailed May 22, 2013.
Non Final Office Action received in corresponding U.S. Appl. No. 13/665,227 mailed on Mar. 19, 2013.

(56) References Cited

OTHER PUBLICATIONS

Notice of Allowance issued in corresponding U.S. Appl. No. 12/473,447 mailed Jun. 7, 2013.

Final Office Action received in U.S. Appl. No. 13/665,227 mailed Jul. 10, 2013.

Notice of Allowance received in U.S. Appl. No. 13/665,227 mailed Oct. 25, 2013.

Jun. 5, 2014—(JP) Office Action—App 2013-216460.

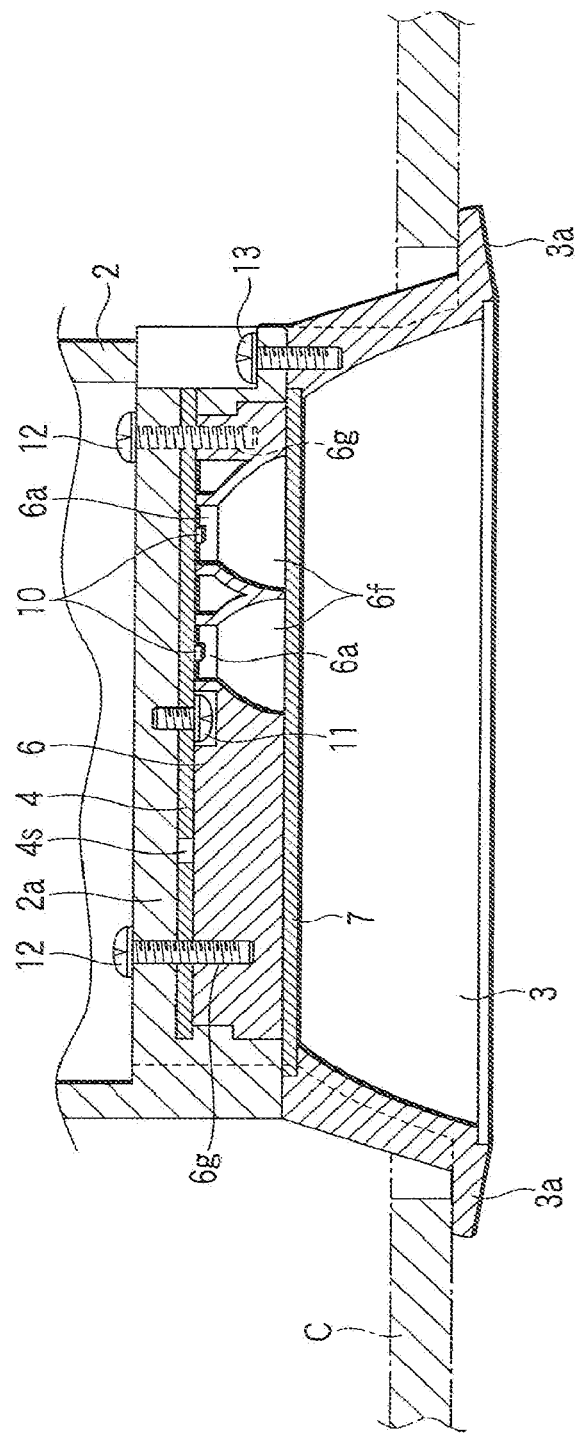
F I G. 6

LIGHT EMITTING MODULE HAVING HEAT CONDUCTIVE SUBSTRATE

CROSS-REFERENCE TO RELATED APPLICATIONS

This application is a continuation of U.S. patent application Ser. No. 13/665,227 filed Oct. 31, 2012, which is a continuation of U.S. patent application Ser. No. 12/473,447 filed May 28, 2009, issued as U.S. Pat. No. 8,556,460 on Oct. 15, 2013, which is based upon and claims the benefit of priority from prior Japanese Patent Applications No. 2008-142063, filed May 30, 2008; and No. 2009-071276, filed Mar. 24, 2009. The entire contents of the above noted applications are incorporated herein by reference.

BACKGROUND

Aspects relate to a substrate having a plurality of light-emitting elements such as LEDs mounted thereon and to a lighting apparatus having this substrate incorporated in an apparatus main body.

Recently, lighting apparatus which uses a plurality of light-emitting elements such as LEDs as light sources have been developed. For lighting apparatus of this type, a demand of a high output is increasing, and there is a tendency that the number of light-emitting elements employed is also increasing.

The plurality of light-emitting elements are mounted on the substrate and incorporated into an apparatus main body. The substrate is subjected to heating and cooling by heat from the light sources as the lighting apparatus is turned on and off, and they repeatedly undergo thermal expansion and thermal contraction. For this reason, the substrate is easily warped or deformed due to heat.

Heretofore, to avoid such thermal deformation of the substrate, the substrate is pressed against the apparatus main body and both members are fastened and fixed at a plurality of positions by using a plurality of screws. As a result, tight connection of the substrate with respect to the apparatus main body can be improved, and heat of the substrate can be excellently conducted to the apparatus main body, thus suppressing warpage or deformation due to heat of the substrate.

However, when the substrate is screwed into the apparatus main body at the plurality of positions as described above, the substrate gets distorted and deformed when the substrate thermally expands and thermally shrinks between the fixing positions. When the substrate is deformed in this manner, a soldered portion to which an electronic component is secured may be cracked or the tight connection of the substrate with respect to the apparatus main body may be degraded in some cases. When the tight connection of the substrate is degraded, heat radiation of the substrate cannot be sufficiently performed, and the substrate is further deformed.

On the other hand, in the field of manufacture of a thinned semiconductor package, there is known a structure where a reinforcing member is disposed to an upper side of a substrate to surround a semiconductor element mounted on the substrate and this- reinforcing member is sealed together with the semiconductor element by a sealing member in order to avoid warpage, breakage due to insufficiency of strength, a mounting error, and others.

However, in the structure depicted in this Patent Document, when linear expansion coefficients of the substrate, the reinforcing member, and the sealing member are different from each other, warpage or deformation occurs in the substrate increasingly. Therefore, selecting materials for the respective members is difficult. Further, since the reinforcing member must be prepared separately from the substrate, the number of components is increased, and the number of manufacturing steps is also increased.

If the reinforcing structure disclosed in this Patent Document is adopted for the substrate in the lighting apparatus having the plurality of light-emitting elements mounted thereon, thermal deformation of the substrate cannot be effectively avoided.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 6 is a partially enlarged cross-sectional view showing a primary part of the down light in FIG. 1 in a partially enlarged manner;

DETAILED DESCRIPTION

Aspects described herein relate to providing a lighting apparatus which can suppress thermal deformation of a substrate having a plurality of light-emitting elements mounted thereon and demonstrate stable performance for a long time, and a substrate incorporated in this lighting apparatus.

For example, a substrate according to an embodiment may comprise a front surface on which a plurality of light-emitting elements are mounted; a plurality of mounting portions which are used for attachment to a lighting apparatus; and stress absorbing means arranged on imaginary straight lines connecting the plurality of mounting portions with each other.

Additionally or alternatively, a lighting apparatus according to an embodiment may comprise an apparatus main body; and the above substrate which is mounted on the apparatus main body.

According to other aspects, a lighting apparatus may include a thermally-conductive apparatus main body; and a substrate which is fixed to the apparatus main body through a plurality of fixing means, has a plurality of light-emitting elements mounted thereon, and has slits which are provided on imaginary straight lines connecting the plurality of fixing means with each other and extended in directions orthogonal to the straight lines.

A substrate may include a plurality of light-emitting elements mounted thereon and may be incorporated in a lighting apparatus. The substrate may also include stress absorbing means for taking out stress caused due to thermal deformation of the substrate between a plurality of fixing means for fixing the substrate at a plurality of positions with respect to a fixing member of the lighting apparatus.

A substrate and lighting apparatus according to the first embodiment of the present invention will be described with reference to FIGS. 1 to 6. As an example of the lighting apparatus, the case where the present invention is applied to a down light 1 will be discussed.

Figure 1:
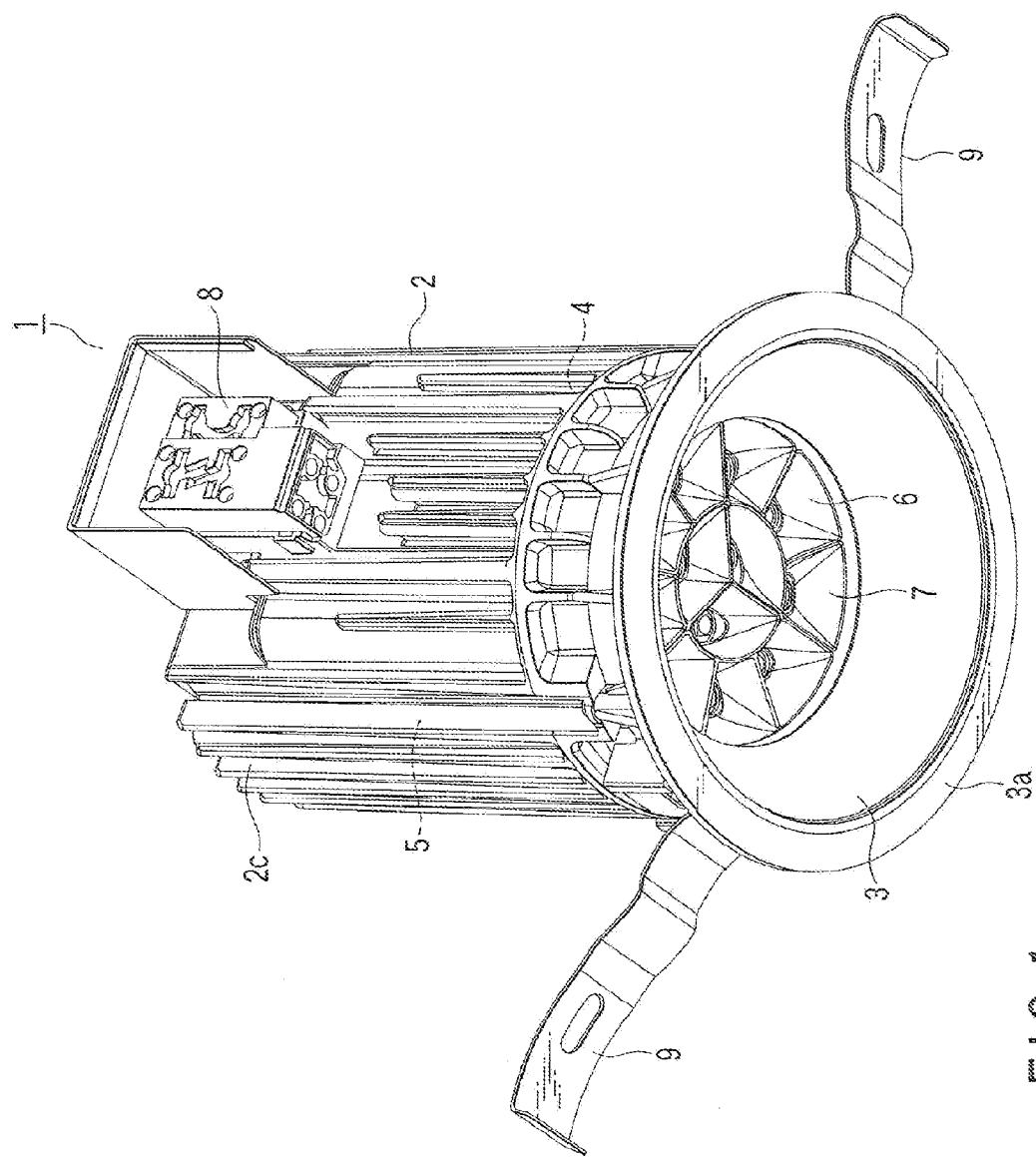
FIG. 1 is a perspective view showing a down light according to a first embodiment of a lighting apparatus of the present invention.
Figure 2:
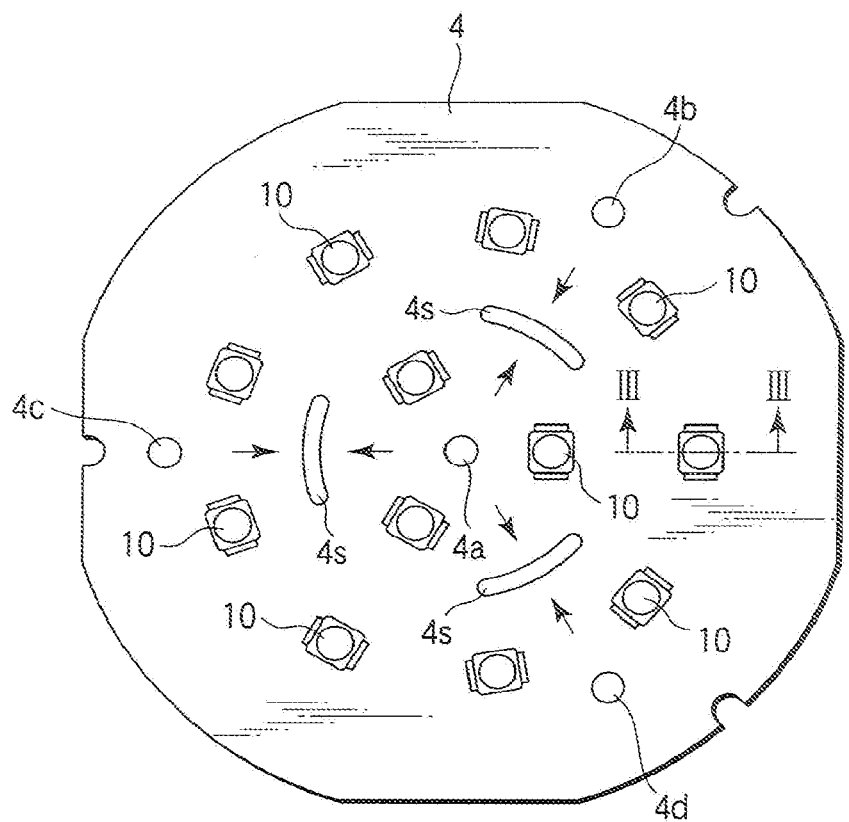
FIG. 2 is a view showing a substrate incorporated in the down light in FIG. 1 as seen from a front surface side thereof.
Figure 3:
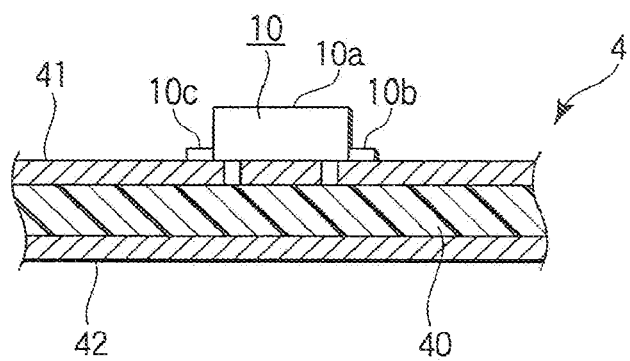
FIG. 3 is a partially enlarged cross-sectional view showing the substrate in FIG. 2 taken along a line III-III.
Figure 4:
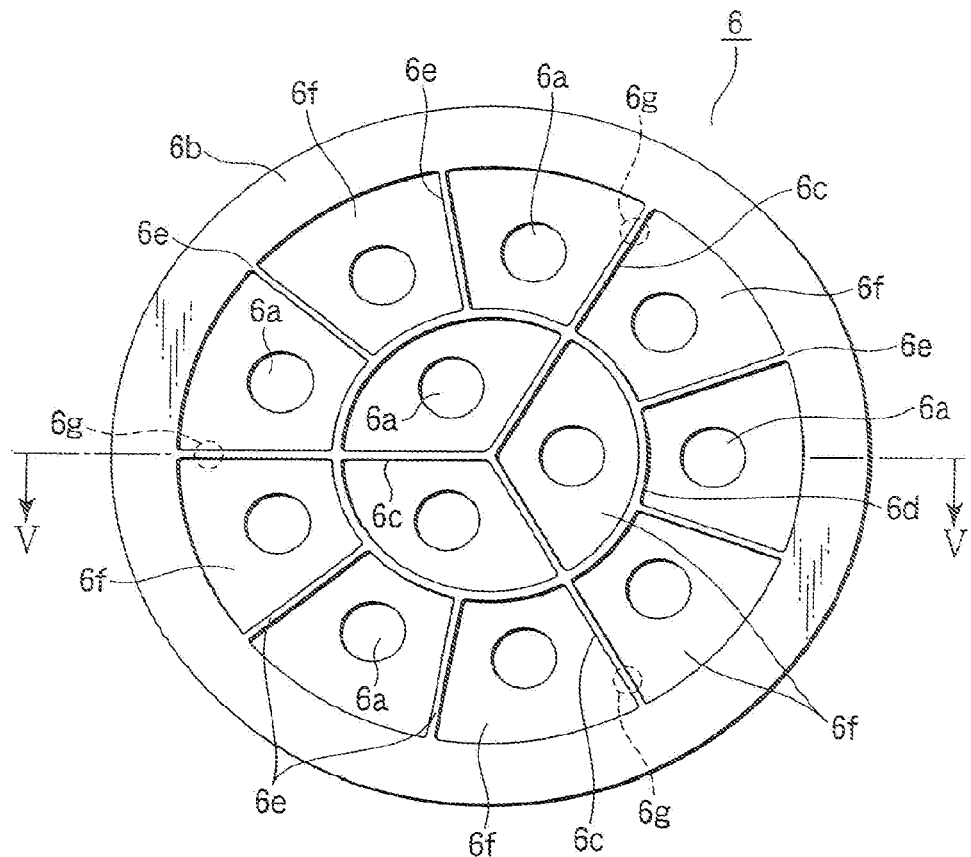
FIG. 4 is a view showing a reflector incorporated in the down light in FIG. 1 as seen from the front surface side thereof.
Figure 5:
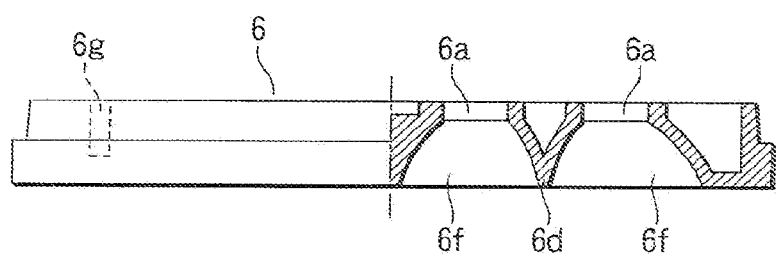
FIG. 5 is a cross-sectional view of the reflector in FIG. 4 taken along a line V-V.

FIG. 1 is a perspective view of the down light 1, FIG. 2 is a view showing a substrate 4 incorporated in the down light 1 as seen from a front surface side thereof, FIG. 3 is a partially enlarged cross-sectional view showing the substrate 4 in FIG. 2 taken along a line III-III, FIG. 4 is a view showing a reflector 6 incorporated in the down light 1 in FIG. 1 as seen from the front surface side thereof, FIG. 5 is a cross-sectional view of the reflector 6 in FIG. 4 taken along a line V-V, and FIG. 6 is a partially enlarged cross-sectional view showing a primary part of the down light 1 in FIG. 1 in a partially enlarged manner.

As light-emitting elements serving as the light source of the down light 1, solid-state light-emitting elements such as light-emitting diode (LED) and organic electro-luminescence (organic EL) are considered. It is preferable that the light-emitting element is mounted on a substrate by the chip-on-board method or surface mounting method; however the present invention is not limited to these mounting methods. Further, the number of light-emitting elements can be set arbitrarily. In each of the following embodiments, the case where an LED 10 is employed as a light-emitting element will be discussed.

FIG. 1 is a perspective view of the down light 1 of the ceiling built-in type. The down light 1 includes a cylindrical main body 2, a decorative frame 3, a substrate 4, a power unit 5, a reflector 6, a light transmitting cover 7, a terminal block 8 and a pair of mounting leaf springs 9. The substrate 4 and power unit 5 are housed within the cylindrical main body 2.

The cylindrical main body 2 is formed of an aluminum die casting, which has a relatively high thermal conductivity. Besides this, it is possible that the cylindrical main body 2 is formed of some other material which has a high thermal conductivity. An outer circumferential surface of the cylindrical main body 2 is provided a plurality of heat releasing fins 2c each extending in an axial direction. Further, the outer circumferential surface is subjected to baking finishing with a white-color melanin resin-based paint. The terminal block 8 to be connected to a utility power is mounted to the outer circumferential surface of the cylindrical main body 2.

The decorative frame 3 is mounted to the lower end of the cylindrical main body 2. The decorative frame 3 is formed of an ABS resin. The decorative frame 3 is formed into an umbrella shape which widens downwards from the end of the cylindrical main body 2 where the frame is mounted, and an annular-shaped flange 3a is formed on the opening end where the frame is widened at maximum. Further, a pair of mounting leaf springs 9 are placed on an inclining outer surface of the decorative frame 3.

As shown in FIG. 2, a plurality of (twelve in this embodiment) LEDs 10 are mounted on the substrate 4. The substrate 4 is placed in a space between the bottom wall 2a of the cylindrical main body 2 and the decorative frame 3 described above, as shown in FIG. 6. In more detail, the rear surface of the substrate 4 is brought into contact with the lower surface of the bottom wall 2a of the cylindrical main body 2, and the rear surface of the reflector 6 is brought into contact with the surface side of the substrate 4. Then, the decorative frame 3 is mounted to the surface side of the reflector 6 while interposing the light transmitting cover 7 therebetween.

As shown in FIG. 3, the substrate 4 has a base plate 40 formed of a glass epoxy resin, a wiring pattern layer 41 formed on a front surface side of this base plate 40, a resist layer (not shown) appropriately provided on this wiring pattern layer 41, and a heat radiation layer 42 formed on a back surface side of the base plate 40. The wiring pattern layer 41 is formed of a material having electrical conductivity, e.g., a copper foil in order to supply electric power to the plurality of LEDs 10 from a power supply.

The LED 10 is a surface-mount type LED package and soldered to a front surface side of the substrate 4. The LED package is roughly constituted of a main body 10a formed of resin, an LED chip mounted on this main body 10a, and a translucent resin for molding, e.g., an epoxy-based resin or a silicone-based resin that seals this LED chip. In this translucent resin, a fluorescent substance which absorbs luminescence of the LED chip and generates yellowish light is dispersed. Further, a pair of terminals, i.e., an anode terminal 10b and a cathode terminal 10c which are connected with the LED chip are extended from the main body 10a in a plane direction, and the anode terminal 10b and the cathode terminal 10c are electrically connected with the wiring pattern layer 41.

The power unit 5 has the structure in which electronic parts such as controller-use ICs, transformers, capacitors and the like are mounted on a circuit board, which is not shown in the figure. The power unit 5 controls the lighting of the LEDs 10 by its lighting circuits. Further, the power unit 5 is electrically connected to the terminal block 8.

The reflector 6 shown in FIG. 4 has a substantially columnar external shape having a relatively short dimension in its axial direction, and it is made of, for example, a white color polycarbonate or an ABS resin. The reflector 6 is placed on the front surface side of the substrate 4, that is, on the lighting side of the LEDs 10, so as to perform luminous intensity distribution control which guide the light emitted from each of the LEDs 10 in its respectively desired direction at a desired intensity.

This reflector 6 contains twelve round floodlight openings 6a on the rear surface side thereof, which is brought into contact with the substrate 4. The twelve round floodlight openings 6a expose the twelve LEDs 10 mounted on the substrate 4, respectively, to the front surface of the reflector 6. Further, the reflector 6 includes an annular-shaped outer peripheral portion 6b on its outer circumference. The outer peripheral portion 6b functions as one of partition walls, which has a height substantially the same as the axial length of the reflector 6.

Within the outer peripheral portion 6b, twelve reflection concave surfaces 6f are formed in the front surface side of the reflector 6 so as to correspond to the twelve round floodlight openings 6a, respectively. Each of the twelve reflection concave surfaces 6f is partitioned by a plurality of partition walls 6c, 6d and 6e each having an angle shape in cross section.

These plurality of partition walls 6c, 6d and 6e each have a height substantially the same as the axial length of the reflector 6 as well. Each of the reflection concave surfaces 6f has such a shape that it opens wider on the front surface side of the reflector 6 from the floodlight opening 6a at its bottom portion towards the ridge line of each of the surrounding partition walls 6c, 6d and 6e. More specifically, each of the reflection concave surfaces 6f has such a shape of substantially a bowl, whose cross section is as shown in FIGS. 5 and 6.

In more detail, on the front surface side of the reflector 6, three radial partition walls 6c radially extending from its central portion towards the outer peripheral portion 6b are formed. The three radial partition walls 6c are arranged at intervals of about 120 degrees from each other. Further, within the outer peripheral portion 6b, a round inner circumferential partition wall 6d is formed such as to divide each of the radial partition walls 6c into two. Furthermore, two dividing partition walls 6e are formed in a radial arrangement from an outer wall of the inner circumferential partition wall 6d located in the middle of each of the radial partition walls 6c towards the outer circumferential portion 6b (a total of six dividing partition walls 6e). Each of the plurality of types of partition walls 6b, 6c, 6d and 6e is formed to have an angle shape in its cross section as seen in FIGS. 5 and 6.

That is, within the round inner circumferential partition wall 6d, three reflection concave surfaces 6f each having substantially a fan shape, which are partitioned by the three radial partition walls 6c, are formed. Further, within the outer circumferential portion 6b but outside of the inner circumferential partition wall 6d, nine reflection concave surfaces 6f each having substantially a trapezoidal shape, which are partitioned by the three radial partition walls 6c and the six dividing partition walls 6e, are formed. Furthermore, at the bottom of each of a total of twelve reflection concave surfaces 6f, a floodlight opening 6a is formed to expose the respective LED 10.

For example, the three reflection concave surfaces 6f each having substantially a fan shape inside the inner circumferential partition wall 6d, are surrounded respectively by the ridge line of the inner circumferential partition wall 6d and the ridge lines of the radial partition walls 6c. On the other hand, the nine reflection concave surfaces 6f each having substantially a trapezoidal shape, in the outside of the inner circumferential partition wall 6d are surrounded respectively by the ridge line of the outer circumferential portion 6b, the ridge lines of the radial partition walls 6c, the ridge line of the inner circumferential partition wall 6d and the ridge lines of the dividing partition walls 6e.

When the twelve LEDs 10 of the down light 1 having the above-described structure are turned on, light emitted from each of the LEDs 10 passes through the light transmitting cover 7 directly and also reflects on the above-described twelve reflection concave surfaces 6f of the reflector and the reflection light passes through the light transmitting cover 7 as well. Here, when the twelve reflection concave surfaces 6f are designed to have an appropriate shape, the distribution of the light emitted from each of the LEDs 10 can be controlled. Thus, it becomes possible to perform highly efficient luminous intensity distribution control in the down light 1 as a whole.

As shown in FIG. 2, a plurality of LEDs 10 are mounted on the front surface side of the substrate 4 by the surface mounting method, and more specifically, a total of twelve of them, three are placed near the central portion and nine are placed around them. These twelve LEDs 10 are placed at positions corresponding to the above-described twelve floodlight openings 6a of the reflector 6.

The substrate 4 is made of an insulation material or a metal-made substantially round disk, and has a screw through hole 4a at its center and three screw through holes 4b, 4c and 4d near the peripheral portion thereof arranged at intervals of 120 degrees from each other. It is to be noted that a slit 4s is formed between the central screw through hole 4a and each of the screw through holes 4b, 4c and 4d around the central screw through hole 4a, and each slit 4s functions as stress absorbing means of the present invention which absorbs expansion and contraction caused by the thermal expansion of the substrate 4.

Each of these three slits 4s is formed into an arched shape around the screw through hole 4a at the center of the substrate 4, and provided on an imaginary straight line connecting the central screw through hole 4a with the peripheral screw through hole 4b, 4c or 4d. In this embodiment, although the three slits 4s are provided as the stress absorbing means between the central hole 4a and the peripheral holes 4b, 4c and 4d in this embodiment, slits which are extended in a radial pattern from the center of the substrate 4 may be formed between the peripheral holes 4b, 4c and 4d in addition to these slits 4s.

In the case where this substrate 4 is to be formed of an insulating material, it is desirable that a ceramic material or a synthetic resin material, which has a relatively good heat radiating property and an excellent durability, is employed. In the case where the substrate 4 is to be formed of a synthetic resin material, it is desirable that, for example, a glass epoxy resin or the like is employed. Alternatively, in the case where the substrate 4 is to be formed of a metal, it is suitable to employ a material having a good thermal conductivity and an excellent heat radiating property, such as aluminum.

Here, a mounting structure of the above down light 1 will be described.

As can be seen in FIG. 6 (in which the illustration of the mounting leaf spring 9 is omitted), the substrate 4 is placed on the bottom wall 2a of the cylindrical main body 2 such that the rear surface of the substrate 4 is brought into contact by surface thereto. Further, the reflector 6 is placed on the front surface side of the substrate 4 such that the rear surface of the reflector 6 is brought into contact therewith. In other words, the substrate 4 is sandwiched between the bottom wall 2a of the cylindrical main body 2 and the reflector 6.

When the substrate 4 and reflector 6 are to be mounted to the bottom wall 2a, the substrate 4 is first secured to the bottom wall 2a (a member to which it is secured). During this process, the mounting screw 11 which functions as securing means of the present invention is put through the central screw through hole 4a from the front surface side of the substrate 4, and then screwed into a threaded hole of the bottom wall 2a, thereby securing the substrate 4 to the bottom wall 2a by engagement. The securing position of the substrate 4 by the mounting screw 11, i.e., the portion of the central screw through hole 4a functions as the mounting portion of the present invention.

Then, the reflector 6 is placed on top of the front surface side of the substrate 4 such that the twelve LEDs 10 mounted on the surface of the substrate 4 are respectively located within the corresponding twelve floodlight openings 6a.

While maintaining this state, three mounting screws 12 which function as the securing means of the present invention (only two of them are illustrated and one of the two is illustrated with an imaginary line) are put through the screw through hole of the bottom wall 2a and the screw through holes 4b, 4c and 4d of the substrate 4, respectively, from the rear surface side of the bottom wall 2a of the cylindrical main body 2, and they are screwed into threaded holes 6g formed in the rear surface side of the reflector 6. The three threaded holes 6g of the reflector 6 are provided on the rear surface side of the reflector 6 at positions which over-lap with the radial partition walls 6c as shown in FIGS. 4 and 5. It is to be noted that the portions of these screw through holes 4b, 4c and 4d also function as the mounting portions of the present invention.

While maintaining this state, as the three mounting screws 12 are fastened, the fastening force acts in the direction in which the reflector 6 is pulled towards the bottom wall 2a. Thus, the fastening forces for the mounting screw 11 at the central portion of the substrate 4 and the surrounding mounting screws 12 synergistically act together to tightly fasten the rear surface of the substrate 4 onto the front surface of the bottom wall 2a. At this time, the reflector 6 is also pushed onto the front surface side of the substrate 4, thereby enhancing the tight connection between both the members.

In particular, at fastening positions (mounting portions) of the mounting screws 11 and 12, the substrate 4 is tightly fastened onto the bottom wall 2a of the cylindrical main body 2, whereby these members are strongly fixed to each other. On the other hand, at portions other than the fastening positions, the substrate 4 can slightly move in a plane direction with respect to the bottom wall 2a. That is, when the substrate 4 thermally expands or thermally shrinks, the portions other than the fastening positions thermally expand or thermally contract in the plane direction.

After that, the decorative frame 3 is mounted to the cylindrical main body 2 by the mounting screw 13. Then, as the down light 1 is built in a ceiling surface C as shown in FIG. 6, the flange 3a which has a diameter larger than that of the embedding hole of the ceiling surface C is hooked at the periphery of the embedding hole from the lower side thereof. It is to be noted that the inner circumferential side of the decorative frame 3 is provided with the light transmitting cover 7 made of an acryl resin or the like so as to cover the opening of the front surface side of each of the twelve reflection concave surfaces 6f of the reflector 6.

Here, the heat radiating structure when the down light 1 having the above-described structure is turned on, and the thermal deformation of the substrate 4 will now be discussed.

When the power unit 5 is energized, the lighting circuit is driven to supply electric power to the substrate 4, and thus the twelve LEDs 10 emit light. Much of the light emitted from each of the LEDs 10 transmits the light transmitting cover 7 directly and irradiates forwards. A portion of the light reflects on each of the reflection concave surfaces 6f of the reflector 6 and the reflection light is subjected to luminous intensity distribution control. Then, the reflection light passes through the light transmitting cover 7 and irradiates forwards as well.

On the other hand, the heat generated from each of the LEDs 10 propagates mainly from the rear surface of the substrate 4 to the bottom wall 2a of the cylindrical main body 2. Further, while being radiated in its propagation process, the heat propagates to the entire body of the cylindrical main body 2, and then radiated through the plurality of heat radiating fins 2c. At this time, needless to say, the substrate 4 is heated and thermally expanded most. When the LEDs 10 are turned off, the thermally expanded substrate 4 is naturally cooled and shrinks to the original size. That is, thermal expansion and thermal shrinkage of the substrate 4 are repeated by repeating turning on/off the LEDs 10.

In particular, when the substrate 4 is made of a resin having a higher thermal expansion coefficient than that of the cylindrical main body 2 formed by die-casting using aluminum, the substrate 4 thermally expands with the portions where the substrate 4 is fastened and fixed to the bottom wall 2a of the cylindrical main body 2 (the portions of the four screw through holes 4a, 4b, 4c and 4d in this embodiment) (which will hereinafter simply be referred to as fixing portions 4a, 4b, 4c and 4d sometimes) at the center, stress is concentrated on portions between the plurality of fixing portions, and warpage or deformation occurs in the substrate 4 in these intermediate portions. However, since the substrate 4 according to this embodiment has the three slits 4s, stress caused due to thermal expansion can be taken out, thus avoiding warpage or deformation of the substrate 4.

It is to be noted that the three slits 4s in the substrate 4 can demonstrate effects even in a reflow process in a manufacturing process of the substrate 4. That is, the plurality of slits 4s suppress deformation of the substrate 4 due to thermal expansion even in the manufacturing process of the substrate 4.

Further, when the substrate 4 is fastened and fixed to the cylindrical main body 2 with the four fixing portions 4a, 4b, 4c and 4d described above, the tight connection of the substrate 4 to the bottom wall 2a is reliably maintained, thereby making it possible to radiate heat effectively from the substrate 4 to the cylindrical main body 2 and suppress the deformation of the substrate 4 as well. Moreover, the rear surface of the reflector 6 is brought into contact with the front surface of the substrate 4 over the substantially entire area thereof, and thus the tightness is assured by this way as well. Therefore, due to the heat conduction from the substrate 4 to the reflector 6, it is possible to prevent a regional temperature increase in the substrate 4 and uniform the temperature distribution of the substrate 4. In this manner, the temperatures of the plurality of LEDs 10 can be uniformed. When the temperature of the substrate 4 can be homogenized in this manner, temperatures of the plurality of lighted LEDs 10 become constant, and unevenness of color, brightness, life duration, and others can be reduced, thereby demonstrating stable excellent performance for a long time.

As described above, in the down light 1 of this embodiment, the number of LEDs 10 mounted on the substrate 4 can be increased, and therefore it is possible to meet the demand of a higher output. Further, in the substrate 4 of this embodiment, the deformation thereof due to heat can be suppressed, and therefore it is possible to prevent defects as cracks in solder portions of the mounted electronic parts. Moreover, according to this embodiment, the tight attachment of the substrate 4 onto the cylindrical main body 2 can be assured, and therefore the heat radiation can be effectively performed and the deformation of the substrate 4 can also be prevented. Therefore, according to the down light 1 of this embodiment, the plurality of LEDs 10 can emit light under the same conditions, and hence stable performance can be exercised for a long time.

Figure 7:
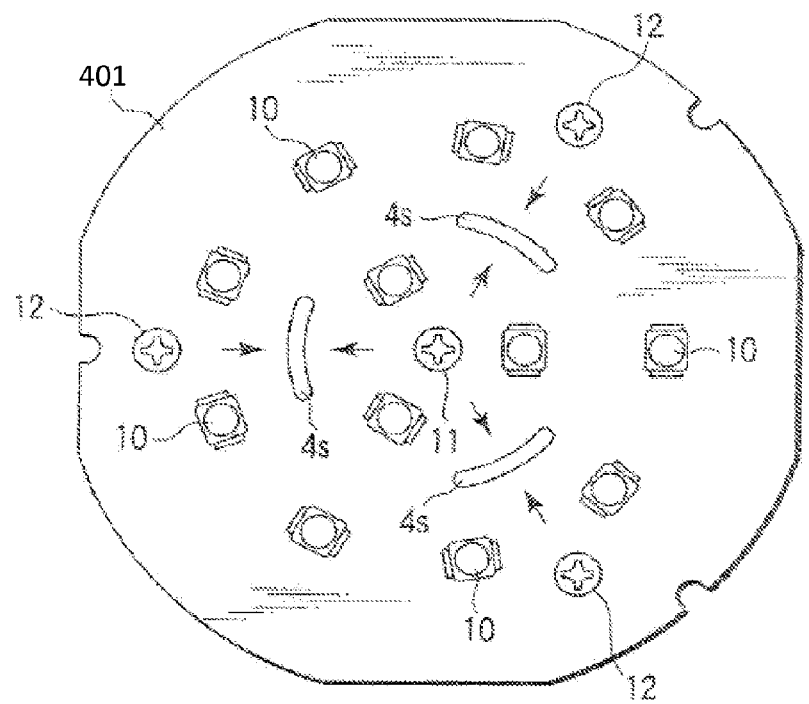
FIG. 7 is a view showing a substrate according to a second embodiment of the present invention as seen from a front surface side thereof.

Next, a substrate 401 according to a second embodiment of the present invention will now be described with reference to FIG. 7. FIG. 7 is a view showing the substrate 401 from a front surface side and corresponds to FIG. 2 in the explanation of the first embodiment. Here, like reference numerals denote parts equal to or corresponding to those in the first embodiment, thereby omitting a tautological explanation.

A method of mounting the substrate 401 onto a cylindrical main body 2 in this embodiment is different from that in the first embodiment. That is, in this embodiment, mounting screws 11 and 12 are inserted into and fastened to a bottom wall 2a of the cylindrical main boy 2 from the front surface side of the substrate 4 to fasten and fix the substrate 401 onto the bottom wall 2a of the cylindrical main body 2. A basic structure of the substrate 401 is the same as that in the first embodiment.

In this embodiment, since slits 4s are likewise formed as stress absorbing means between the mounting screw 11 and the three mounting screws 12, concentration of stress caused due to thermal expansion of the substrate 401 can be avoided, and a mounting state of the substrate 401 can be stably maintained like the first embodiment. Furthermore, tight connection with respect to the cylindrical main body 2 can be enhanced, and deformation of the substrate 401 can be suppressed, thus maintaining the tight connection of the substrate 401 to the cylindrical main body 2.

Moreover, adopting the method of mounting the substrate 401 according to this embodiment enables inserting and fastening the mounting screws 11 and 12 from the front surface side of the substrate 401, and assembling workability of a down light 1 can be improved. The respective mounting screws 11 and 12 can be securely fastened, and the tight connection of the substrate 401 to the bottom wall 2a of the cylindrical main body 2 can be further improved.

Figure 8:
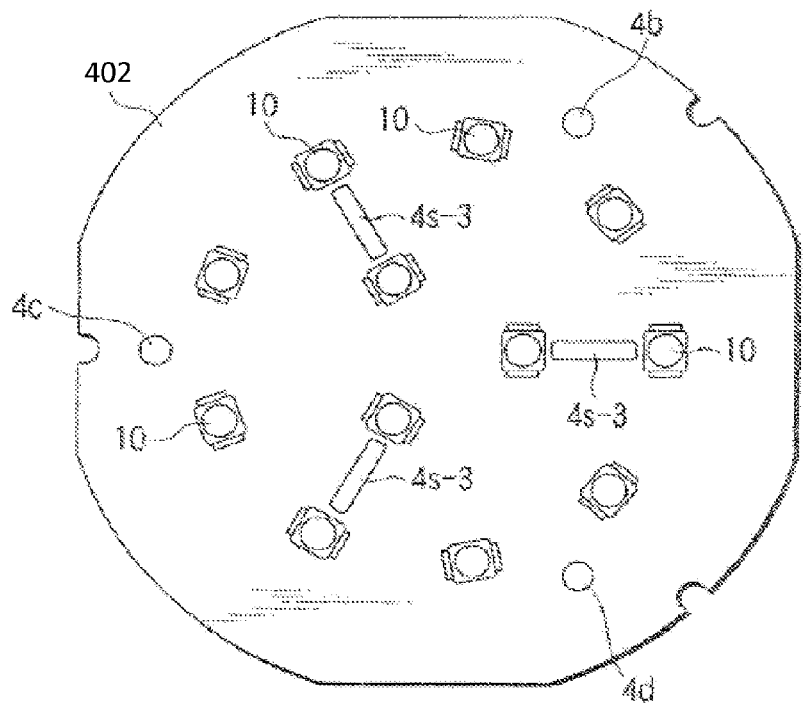
FIG. 8 is a view showing a substrate according to a third embodiment of the present invention as seen from a front surface side thereof.

A substrate 402 according to a third embodiment of the present invention will now be described with reference to FIG. 8. FIG. 8 is a view showing the substrate 402 from a front surface side and corresponds to FIGS. 2 and 7 of the respective embodiments. In this example, like reference numerals likewise denote constituent elements having the same functions as those in the foregoing embodiments, thereby omitting a detailed explanation thereof.

The substrate according to this embodiment is different from those of the foregoing embodiments in that a screw through hole 4a at a central portion of the substrate 402 is omitted and three slits 4s-3 having different shape and directions are provided. That is, each of the slits 4s-3 is provided at a substantially central part of each side of an imaginary regular triangle connecting three screw through holes 4b, 4c and 4d formed in the substrate 402 in such a manner that each slit becomes substantially orthogonal to each side.

In this embodiment, since the slits 4s-3 are provided between the fixing portions 4b, 4c and 4d of the substrate 402, the same effects as those in the respective foregoing embodiments can be exercised, and concentration of stress caused due to thermal expansion of the substrate 402 can be avoided, thereby suppressing warpage or deformation of the substrate.

Moreover, according to this embodiment, since the screw through hole 4a at the center of the substrate 402 is omitted and directions of the slits 4s-3 are changed to a radial pattern extending from the center of the substrate 402, a reduction in strength due to formation of the slits or the screw holes in the substrate 402 can be suppressed. Additionally, since the screw through hole 4a at the center is omitted, the number of manufacturing steps of the substrate 402 can be decreased.

Figure 9:
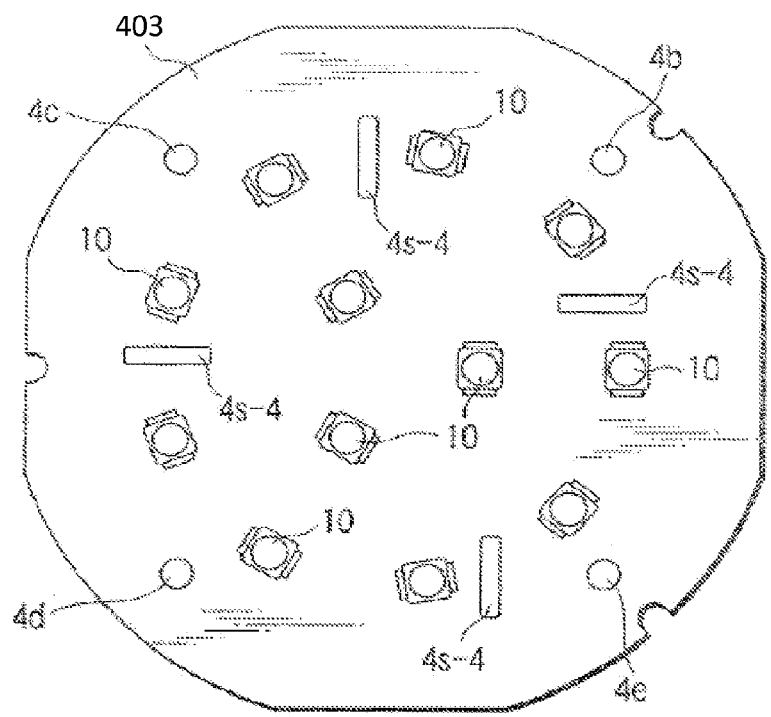
FIG. 9 is a view showing a substrate according to a fourth embodiment of the present invention as seen from a front surface side thereof.

FIG. 9 is a view showing a substrate 403 according to a fourth embodiment of the present invention from a front surface side. In this embodiment, screw through holes 4b, 4c, 4d and 4e are formed at four positions in a peripheral portion of the substrate 403 at equal intervals, and each of substantially rectangular slits 4s-4 is formed on each side of an imaginary square connecting these four holes. It is to be noted that, although not shown, a slit may be formed on each diagonal line connecting the screw through holes 4b and 4d or the screw through holes 4c and 4e.

In this embodiment, the same effects as those in the foregoing embodiments can be demonstrated, and concentration of stress caused due to thermal expansion of the substrate 403 can be avoided, whereby warpage or deformation of the substrate 403 can be suppressed.

Figure 10:
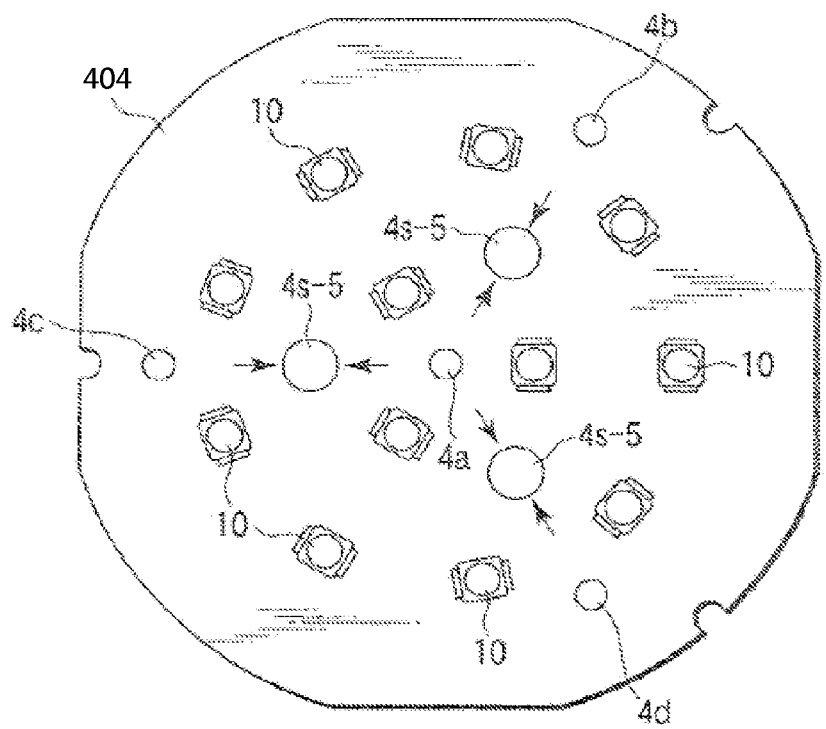
FIG. 10 is a view showing a substrate according to a fifth embodiment of the present invention as seen from a front surface side thereof.

FIG. 10 is a view showing a substrate 404 according to a fifth embodiment of the present invention from a front surface side. The substrate 404 according to this embodiment has substantially the same structure as that of the substrate 4 according to the first embodiment except that three circular holes 4s-5 are formed in place of the three arched slits 4s. Therefore, here, like reference numerals denote constituent elements having the same functions as those in the first embodiment, thereby omitting a detailed explanation thereof.

In this embodiment, the same effects as those in the respective foregoing embodiments can be exercised, and concentration of stress caused due to thermal expansion of the substrate 404 can be avoided, whereby deformation and deformation of the substrate can be suppressed.

Figure 11:
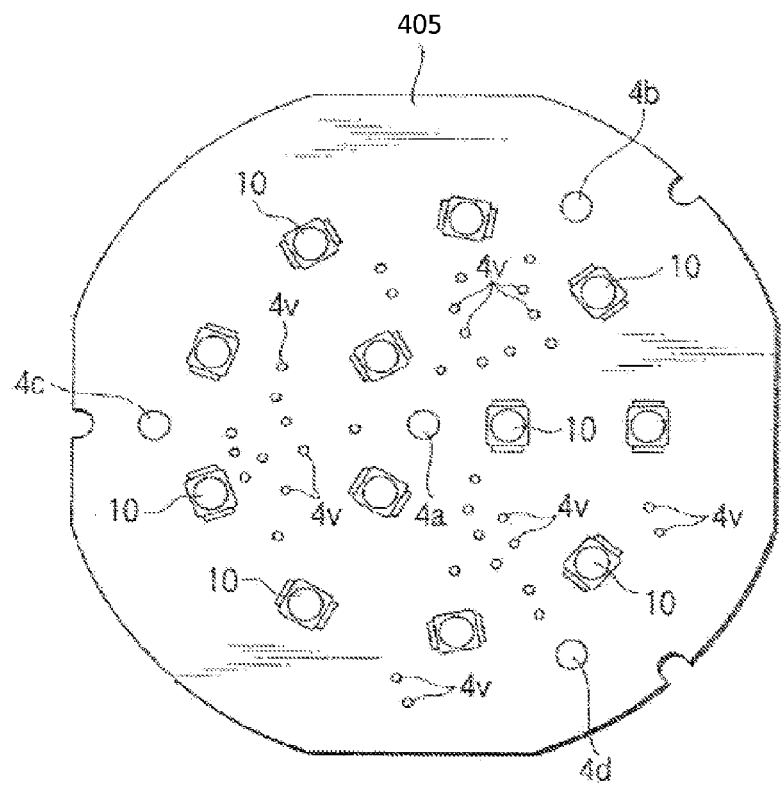
FIG. 11 is a view showing a substrate according to a sixth embodiment of the present invention as seen from a front surface side thereof.
Figure 12:
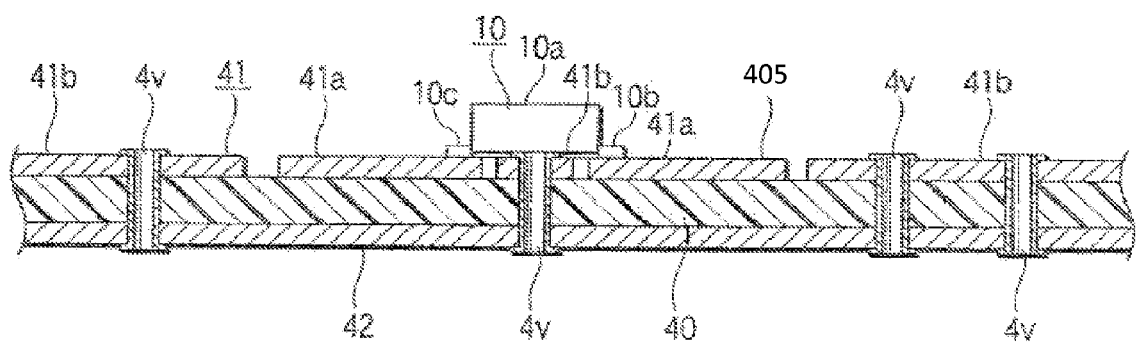
FIG. 12 is a partially enlarged cross-sectional view showing the substrate in FIG. 11 cut at positions of via holes.

FIG. 11 is a view showing a substrate 405 according to a sixth embodiment of the present invention from a front surface side. Further, FIG. 12 is a partially enlarged cross-sectional view in which the substrate 405 is cut at positions of via holes 4v. In this embodiment, so-called via holes 4v are formed as stress absorbing means in the substrate 405. It is to be noted that the substrate 405 according to this embodiment has the same structure as that in the first embodiment except that the plurality of via holes 4v are provided in place of the arched slits 4s, and hence like reference numerals denote constituent elements that function in the same manner as the first embodiment, thereby omitting a detailed explanation thereof.

As shown in FIG. 11, the via holes 4v constituted of many small holes are formed as the stress absorbing means according to the present invention in the substrate 405. The plurality of via holes 4v are arranged at least between a screw through hole 4a at a central portion as a fixing portion and screw through holes 4b, 4c and 4d at a periphery. Further, the via holes 4v may be formed on respective sides of an imaginary triangle having the peripheral screw through holes 4b, 4c and 4d as apexes.

As shown in FIG. 12, a wiring pattern layer 41 formed on a front surface side of the substrate 405 is formed of a material having electrical conductivity, e.g., a copper foil in order to supply electric power from a power supply to a plurality of LEDs 10. In this embodiment, this wiring pattern layer 41 is constituted of a conductive layer 41a which actually supplies electric power to electronic components, e.g., the LEDs 10 and a non-conducting layer 41b which is not electrically connected with electronic components and through which electric power is not conducted.

This non-conducting layer 41b is formed on the front surface side of the substrate 405 and has a function of radiating heat of the substrate 405 and homogenizing a temperature on the front surface of the substrate 405. On the other hand, a heat radiation layer 42 formed on a back surface side of the substrate 405 is made of a material having excellent heat conductivity, e.g., a copper foil. Furthermore, the plurality of via holes 4v are formed by performing copper plating processing with respect to an inner peripheral surface of each through hole pierced from the non-conducting layer 41b to the heat radiation layer 42.

Therefore, although the plurality of via holes 4v do not electrically connect the layers on the front and back surface sides of the substrate 405, i.e., the non-conducting layer 41b and the heat radiation layer 42 with each other, they connect the layers 41b and 42 on the front and back surface sides of the substrate 405 with each other to achieve heat conduction for heat radiation and temperature homogenization.

That is, heat generated from the plurality of LEDs 10 mounted on the front surface side of the substrate 405 is conducted to the wiring pattern layer 41 (the conductive layer 41a and the non-conducting layer 41b) and transferred to the heat radiation layer 42 through the plurality of via holes 4v connected with the non-conducting layer 41b. Moreover, the heat of the substrate 405 is conducted to a cylindrical main body 2 through the heat radiation layer 42 which is in surface-contact with a bottom wall 2a of the cylindrical main body 2 and radiated through a plurality of radiation fins 2c.

As explained above, according to this embodiment, heat of the LEDs 10 can be effectively conducted from the non-conducting layer 41b to the heat radiation layer 42 through the plurality of via holes 4v, and appropriately setting the number or positions of the via holes 4v enables homogenizing a temperature in a temperature distribution on the front surface of the substrate 405. That is, the plurality of via holes 4v function as stress absorbing means to avoid thermal deformation of the substrate 405 and function as heat transferring means to contribute to homogenizing a temperature of the substrate 405, i.e., homogenizing temperatures of the plurality of LEDs 10.

That is, although the substrate 405 expands due to heat generated from the plurality of LEDs 10, since the plurality of via holes 4v are present between the central screw through hole 4a and the peripheral screw through holes 4b, 4c and 4d as fixing portions, stress caused due to thermal expansion can be absorbed by the plurality of via holes 4v, thereby suppressing warpage or deformation of the substrate 405.

It is to be noted that arranging the plurality of via holes 4v to be present at least between the fixing portions can suffice. Specific arrangement positions or number of the via holes 4v can be appropriately selected while considering heat radiation characteristics of a down light 1 or the substrate 405 or a degree of absorption of thermal expansion of the substrate 405.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, although the slits or the holes are simply formed in the substrate 4 as the stress absorbing means to avoid concentration of stress caused due to thermal deformation in the respective foregoing embodiments, the slits or the holes may be filled with a different material, e.g., an elastic member to avoid concentration of stress caused due to thermal expansion.

Additionally, the via holes 4v formed in the substrate 4 in the sixth embodiment described with reference to FIGS. 11 and 12 may be formed in the substrate 4 in each of the first to fifth embodiments, and the same effects as those in the sixth embodiment can be thereby demonstrated. In this case, if the substrate 4 according to the first embodiment is used, a copper foil can be formed on an inner peripheral surface of each slit 4s to connect the front and back surfaces of the substrate 4 with each other.

Further, although the structure where the substrate 4 is fixed to the bottom wall 2a of the apparatus main body 2 as a fixing member on the lighting apparatus 1 side to which the substrate 4 is disposed has been explained in the foregoing embodiments, the present invention is not restricted thereto, and the substrate 4 may be fixed to, e.g., a so-called main body, a case, a cover, or a heat radiation member as the fixing member that is used to fix the substrate 4.

Furthermore, although the structure where the slits or the holes as the stress absorbing means are arranged on imaginary straight lines connecting the plurality of mounting portions of the substrate 4 has been explained in the foregoing embodiments, the stress absorbing means do not have be necessarily provided between all the mounting portions, and the number or positions of the stress absorbing means can be appropriately set in accordance with heat-resisting properties required for the lighting apparatus 1 to which the present invention is applied.

What is claimed is:

1. A module substrate comprising:
a substrate comprising a first surface and a second surface opposite to the first surface;
a light-emitting element mounted on the first surface;
an electrically conducting layer on the first surface, wherein the electrically conducting layer is connected to the light-emitting element; and
a heat-conductive hole comprising a through hole extending entirely through the substrate between the first surface and the second surface and a heat-conductive material covering an inner surface of the through hole, wherein the material covering the inner surface of the through hole is not electrically connected to the electrically conducting layer.

2. A lighting apparatus comprising:
an apparatus main body; and
a module substrate, the module substrate comprising:
a substrate comprising a first surface and a second surface opposite to the first surface;
a light-emitting element mounted on the first surface;
an electrically conducting layer on the first surface, wherein the electrically conducting layer is connected to the light-emitting element; and
a heat-conductive hole comprising a through hole extending entirely through the substrate between the first surface and the second surface and a heat-conductive material covering an inner surface of the through hole, wherein the material covering the inner surface of the through hole is not electrically connected to the electrically conducting layer.

* * * * *